United States Patent [19]
Berrou et al.

[11] Patent Number: 6,119,264
[45] Date of Patent: Sep. 12, 2000

[54] DATA BLOCK CONVOLUTIONAL CODING DEVICE AND METHOD, AND CORRESPONDING DECODING METHOD AND DEVICE

[75] Inventors: Claude Berrou, Locmaria-Plouzane; Michel Jezequel, Brest, both of France

[73] Assignee: France Telecom & Telediffusion de France S.A., Paris, France

[21] Appl. No.: 09/155,819

[22] PCT Filed: Apr. 3, 1997

[86] PCT No.: PCT/FR97/00607

§ 371 Date: Apr. 19, 1999

§ 102(e) Date: Apr. 19, 1999

[87] PCT Pub. No.: WO97/38495

PCT Pub. Date: Oct. 16, 1997

[30] Foreign Application Priority Data

Apr. 3, 1996 [FR] France .................................. 96 04455

[51] Int. Cl.[7] .................................................. H03M 13/03
[52] U.S. Cl. .......................................................... 714/786
[58] Field of Search ..................................... 714/786, 790, 714/794, 795

[56] References Cited

U.S. PATENT DOCUMENTS

| | | | |
|---|---|---|---|
| 4,293,951 | 10/1981 | Rhodes ...................................... | 714/786 |
| 5,406,570 | 4/1995 | Berrou et al. ............................. | 714/792 |
| 5,446,747 | 8/1995 | Berrou ...................................... | 714/788 |

OTHER PUBLICATIONS

Pyndiah et al., Near Optimum Decoding of Product Codes, IEEE, pp. 339–343, 1994.

Berrou et al., Near Shannon Limit Error–Correcting Coding and Decoding: Turbo–Codes (1), IEEE, pp. 1064–1070, 1993.

Haganauer, Source–Controlled Channel Decoding, IEEE, pp. 2499–2457, 1995.

Jung, Comparison of Turbo Codes Decoders Applied to Short Frame Transmission Systems, IEEE pp. 530–537, Apr. 1996.

Robertson, Improving Decoder and Code Structure of Parallel concatenated Recursive Systematic (Turbo) Codes, IEEE, pp. 183–187, Apr. 1994.

Benedetto et al., Design Guidelines of Parallel Concatenated Convolutional codes, IEEE, pp. 2273–22777, May 1995.

Thitimajshima, Recursive Systematic Convolutional Codes and Application to parallel Concatenation, IEEE, pp. 2267–2272, May 1995.

Qiang Wang and Vijay K. Bhargava, "An Efficient Maximum Likelihood Decoding Algorithm for Generalized Tail Biting Convolutional Codes Including Quasicyclic Codes", IEEE Transactions on Communications, pp. 875–879; Aug. 8, 1989, New York, USA.

*Primary Examiner*—Albert Decady
*Assistant Examiner*—Shelly A Chase
*Attorney, Agent, or Firm*—Kinney & Lange, P.A.

[57] ABSTRACT

Disclosed are a method and a device for the convolutive encoding of blocks each formed by a predetermined number N of source data elements, wherein each of said source data elements is introduced twice into one and the same convolutive encoder implementing a generating polynomial with a period L in an order such that the two instances of introduction of one and same source data element $d_i$ are separated by the introduction of $(p_i \cdot L)-1$ other source data elements, $p_i$ being a non-zero integer. Also disclosed are a corresponding decoding method and device that can be applied, in particular, to the transmission of short messages, for example in radiotelephony, for satellite communications or gain computer telecommunications (Internet for example). FIG. 2.

13 Claims, 4 Drawing Sheets

• TURBO-CODE (#7)
∘ BCH (127, 64, t=10)

DATA BLOCK CONVOLUTIONAL CODING DEVICE AND METHOD, AND CORRESPONDING DECODING METHOD AND DEVICE

BACKGROUND OF THE INVENTION

1. Field of the Invention

The field of the invention is that of the encoding of digital data and especially source data organized in blocks of data, or messages, that are independent of one another and have to be encoded and decoded on a unit basis.

More specifically, the invention relates to a method and device of convolutive type error-correcting encoding adapted to the constraints laid down by the transmission of messages and especially short messages (for example of about some tens or some hundreds of bits). The invention also relates to a decoding method and device adapted to the encoding method of the invention.

The invention can be applied in all cases where it is necessary to transmit digital information with a certain degree of reliability. A preferred field of application of the invention is that of digital transmission on highly noise-infested channels. For example, the invention can be implemented for the transmission and reception of signals by satellite. In particular, the invention can be used for communications with orbiting satellites. Indeed, in systems that implement such satellites, communications can only take place in very short data bursts, when the satellites are in the axis of the terrestrial antenna.

The invention can also be advantageously used for space transmissions towards or between space vehicles and/or space probes and in all cases where the reliability of the decoding is of vital importance.

More generally, however, the invention can be applied in the same way to all types of transmission, by RF channels or by cable. In particular, it can be used for digital radio-communications systems such as the GSM system. Another possible application is that of data transmission on computer networks and especially on the Internet.

Any digital signal, whatever its origin, may be encoded and decoded according to the invention provided that it is organized in blocks of fixed size.

2. Description of the Prior Art

It is known that convolutive encoders are particularly efficient in terms of error correction quality. It will be recalled that, in general, the convolutive codes are codes that associate at least one encoded data element with each source data element to be encoded, this encoded data element being obtained by the modulo 2 summation of this source data element with at least one of the previous source data elements. Thus each encoded symbol is a linear combination of the source data element to be encoded and the previous source data elements taken into account.

In the decoder, the original data elements are most usually reconstructed by means of a maximum likelihood algorithm, for example the Viterbi algorithm, whose decisions may, if necessary, be weighted. This algorithm takes account of a sequence of received encoded symbols to give an estimation of each encoded data element at transmission in determining the source sequence that most probably corresponds to the received sequence.

Among the convolutive codes, there is a very advantageous technique known as the "turbo-code". Turbo-codes are described in particular in the European patent document EP-92 460013.3 entitled "Procédé de codage correcteur d'erreurs à au moins deux encodages convolutifs systématiques en paralléle, Procédé de décodage itératif, module de décodage et décodeur correspondents" (Method of error correcting-encoding with at least two systematic convolutive encodings in parallel, iterative decoding method and corresponding decoding module and decoder), and in the article by C. Berrou, A. Glavieux and P. Thitimajshima, "Near Shannon limit error-correcting coding and decoding: 'turbo-codes'", Proceedings of IEEE ICC '93, Geneva, pp. 1064–1070, May 1993.

Turbo-codes are quasi-optimal binary correcting codes inasmuch as their corrective capacity is close to the theoretical limit predicted by Shannon in 1947.

A turbo-code is built out of a parallel concatenation of recursive systematic convolutive (CSR) codes coupled by a non-uniform interleaving.

The decoding, which cannot be comprehensive given the very large number of states to be considered, makes use of an iterative process relying on the concept of extrinsic information. The decoding complexity is compatible with the present densities of integration on silicon, and this technique is already leading to the creation of physical embodiments.

Turbo-codes and more generally convolutive encoding are quite appropriate to the transmission of long messages, for example with non-stop broadcasting.

By contrast, when it is necessary to protect short messages with a length N, there is a problem of knowing the final state of the encoder after the N bits have been applied to it. If this information is not given, or if the state of the encoder is not set at a known value by the application of additional bits ("tail bits"), the decoder, for example a Viterbi decoder, loses its corrective capacity.

Furthermore, if the code is not "closed", it is impossible to implement a sequential decoding that always relies, in the course of an iterative process, on the same decoding unit.

At another level, and again for short messages, it is difficult to use the technique of concatenation (typically a BCH block code or a Read-Solomon code followed, after interleaving, by a convolutive code) to obtain high correcting capacity: either the block code requires a block length greater than that of the message (in the case of the Read-Solomon code) or else the size of the interleaving is far too great (as in the case of the BCH code). It is therefore the practice today to make do with either a convolutive code with termination bits or a block code, and therefore to accept a very ordinary level of correction capacity.

Studies have been conducted on block turbo-codes using BCH codes as elementary codes. These are described especially in the article by R. Pyndiah, A. Glavieux, A. Picart and S. Jacq, "Near optimum decoding of product codes" in Proceedings of IEEE GLOBECOM '94, Vol. 1/3, pp. 339–343, November–December 1994.

The results are excellent but the encoding pattern has drawbacks such as the complexity of the decoder, a lack of flexibility in encoding efficiency levels and large sizes of blocks. The convolutive block turbo-codes described hereinafter also give excellent performance characteristics. They are relatively simple to decode and provide great flexibility in the choice of encoding efficiency and block sizes.

The goal of the invention in particular is to overcome these different drawbacks of the prior art.

SUMMARY OF THE INVENTION

More specifically, it is a goal of the invention to provide a method and a corresponding device of convolutive encoding that have the advantages of the turbo-codes and are suited to block encoding or message encoding.

In particular, it is a goal of the invention to provide an encoding method of this kind that makes it possible to "close" the code so that each block is processed independently, at transmission or reception, while providing of course for high corrective capacity.

It is another goal of the invention to provide a decoding method of this kind that is simple to implement without requiring major resources and is also simple to decode.

It is also a goal of the invention to provide a method of this kind that imposes no particular constraint on the size of the blocks to be processed and especially does not dictate any minimum size and offers great flexibility in the choice of encoding efficiency.

Furthermore, it is also a goal of the invention to provide a corresponding method of decoding that is simple and costs little to implement.

It is a goal of the invention to provide a method of this kind whose operation can be adapted for example to a maximum error rate desired. At the same time, it is a goal of the invention to provide a decoding method of this kind enabling the definition of several types of receivers in terms of error correction efficiency on the basis of one and the same encoding operation.

These goals as well as others that shall appear hereinafter are achieved, according to the invention, by means of a method for the convolutive encoding of blocks each formed by a predetermined number N of source data elements, a method wherein each of said source data elements is introduced twice into one and the same convolutive encoder implementing a generating polynomial with a period L in an order such that the two instances of introduction of one and same source data element $d_i$ are separated by the introduction of $(p_i.L)-1$ other source data elements, $p_i$ being a non-zero integer.

This technique of systematic repetition makes it possible to ensure that the code is closed, as explained hereinafter. In other words, the initial state and the final state of the encoding register are perfectly known to the decoder, whatever the data elements forming the message. This enables the initializing of the decoder. No termination data element is needed to close the code.

Many ways of applying the data elements twice to the encoder can be envisaged, provided that they comply with the rules given here above.

According to an advantageous embodiment which gives efficient results, said source data elements are introduced into said encoder for a first time (these are called original data elements) in their natural order and then a second time (they are then called duplicated data elements) in an order such that the two instances of introduction of one and the same source data element $d_i$ are separated by the introduction of $(p_i.L)-1$ other source data elements, $p_i$ being a non-zero integer.

This order of introduction of said duplicated data elements may be obtained in particular by:
  recording the source data elements row by row in a memory with a size $N=n_1 * n_c$, $n_1$ being the number of rows which is a multiple of L and $n_c$ being the number of columns which is a prime number with L; and
  reading said duplicated data elements column by column in travelling, on a given column at the instant $k_2$, through the successive rows until there is found a data element that has been used for a first time (original data element) at the instant $k_1$ such that $k_1 - k_2$ is a multiple of L.

Preferably, the encoding according to the invention is a systematic encoding, said source data elements being systematically transmitted in conjunction with the data elements delivered by said encoder.

This technique proves to be particularly efficient and enables the implementation of the iterative decoding method described hereinafter.

In order to improve the efficiency of the encoding, the method of the invention may provide for the implementation of a punching of the data delivered by said encoder.

The blocks considered may have any size. According to a first embodiment, this number N of source data elements forming a block is a multiple of the period L of the generating polynomial of said encoder.

According to a second embodiment, when the number N of source data elements forming a block is not a multiple of the period L of the generating polynomial of said encoder, each of said blocks is complemented by a number N'N of fixed values, N' being the multiple of L that is immediately greater than N.

In this case, said fixed values are preferably not transmitted and known to the receivers. Said fixed values may be introduced:
  in the form of a block at the beginning or end of a block;
  evenly distributed among the data elements forming said block.

The invention of course also relates to devices implementing a method of this kind. A device of this kind comprises, in particular, means for the introduction of each of said source data elements twice into one and the same convolutive encoder implementing a generating polynomial with a period L, in an order such that the two instances of introduction of one and the same source data element $d_i$ are separated by the introduction of $(p_i.L)-1$ other source data elements, $p_i$ being a non-zero integer.

Furthermore, the invention relates to a corresponding method of decoding, comprising a maximum likelihood decoding step taking account, firstly, of the received encoded data elements and, secondly, of the fact that the initial state and the final state of the encoder are known.

Preferably, since said encoding is a systematic encoding, the decoding method implements an iterative procedure comprising:
  the duplication of the original symbols received and the association, with each of them, of one or other of the redundant data elements received so as to form 2. N pairs of information elements to be decoded;
  a first iteration comprising the following steps:
    the initialization of the decoding so as to take account of the initial state of the encoder;
    the determining, for each pair of information elements, of an estimation $s_k$ of this pair and of an extrinsic information element $z_k$ representing the confidence associated with said estimation, as a function of the encoded data elements and the redundancy data elements received, and in taking account of the fact that the initial state and the final state of the encoder are known;
  at least one intermediate iteration, repeating the determination step, in replacing the source data elements received by a weighted combination of the source data elements received and of the dual extrinsic information (namely the information relative to the duplicated data element);
  a last iteration delivering a definitive estimation of the data elements received corresponding to the summing of the estimation obtained from one of the redundancy symbols with the extrinsic information obtained from the other redundancy symbol, for each source symbol.

This technique makes it possible to simplify the decoders and proves to be particularly efficient. The number of iterations is a function of the decoding efficiency sought.

Advantageously, a redundancy data element is set at a neutral value when this value has been eliminated by punching at transmission.

Preferably, a logarithmic law is applied to the absolute value on the estimations produced during said steps of determination.

This makes it possible to prevent a heavyweight error from being amplified during the iterative process.

At least two embodiments can be envisaged. Indeed, said iterations are implemented in:

reusing a single decoder several times, at a rate greater than that of the transmitted data element;

cascading several decoding modules, each corresponding to an iteration.

The former case corresponds especially to applications with relatively low bit rates enabling several iterations to be performed during the transmission of one block.

The invention also relates to decoders implementing this method. They comprise especially maximum likelihood decoding means taking account, firstly, of the encoded data elements received and, secondly, of the fact that the initial state and the final state of the encoder are known.

BRIEF DESCRIPTION OF THE DRAWINGS

Other features and advantages of the invention shall appear more clearly from the following description of a preferred embodiment of the invention, given as a simple illustration, and from the appended drawings of which.

MORE DETAILED DESCRIPTION

The invention therefore relates to digital communications. It proposes an encoding and decoding technique enabling the efficient correction of the errors introduced by transmission. It is aimed in particular at improving the quality of the transmissions in the presence of disturbance-causing factors such as noise and/or jammers.

It is particularly suited to the transmission of short messages. It can therefore be applied for example in systems of radiocommunications with mobile units or in transmissions via satellites.

Figure 1:
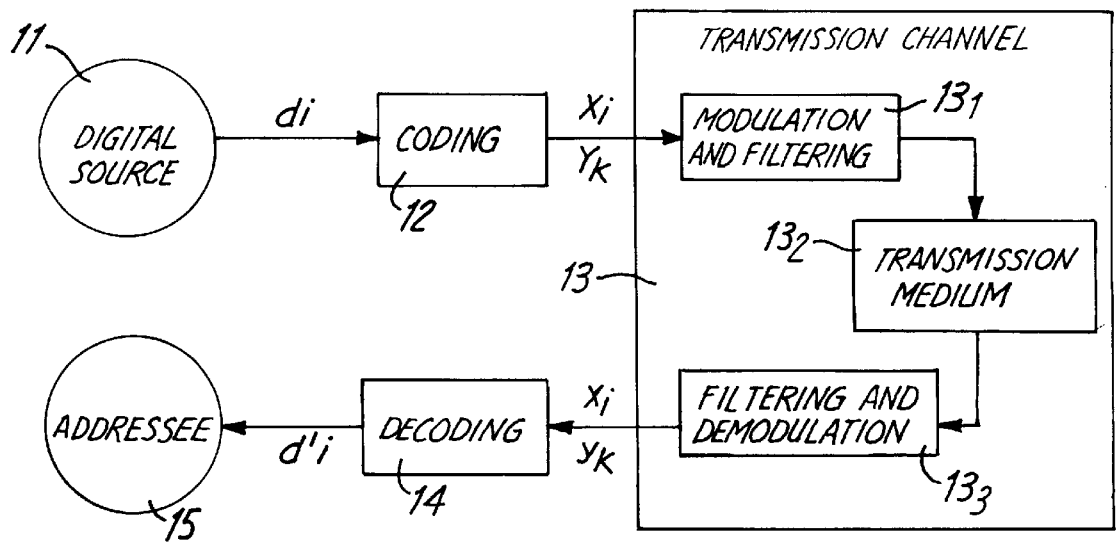
FIG. 1 provides a diagrammatic view of the transmission line in which the encoding and decoding methods of the invention can be implemented.

The transmission line into which the method of the invention is incorporated is shown in FIG. 1.

The signals to be transmitted are delivered by a digital source 11 in the form of finite messages (or blocks), each comprising N data elements $d_i$. The data elements $d_i$ may correspond to any type of known signal (digital or analog signal that has undergone preliminary sampling). As the case may be, the finite messages may of course correspond to longer, or even non-stop, messages subdivided into the desired format.

Each message then undergoes an encoding 12 according to the method of the invention, to provide encoded messages (or packets) comprising T encoded data elements (or symbols). Should a systematic encoding be implemented, these symbols comprise firstly the source data elements $X_i$ and secondly redundancy data elements $Y_k$.

The encoded message is then transmitted to the addressee through the transmission channel 13 which gives rise to different disturbances in the signal. The transmission channel 13 may be split up into three elements: the modulation and the filtering 131 at transmission, the transmission medium 132 proper and the filtering and demodulation 133. Conventionally, the operations 131 and/or 133 comprise especially methods to curb inter-symbol interference.

The data elements received $x_i$ and $y_k$ supply the decoding device 14 implementing the method of the invention in order to provide an estimated message formed by estimated source data elements $d'_i$ to the addressee 15.

Figure 2:
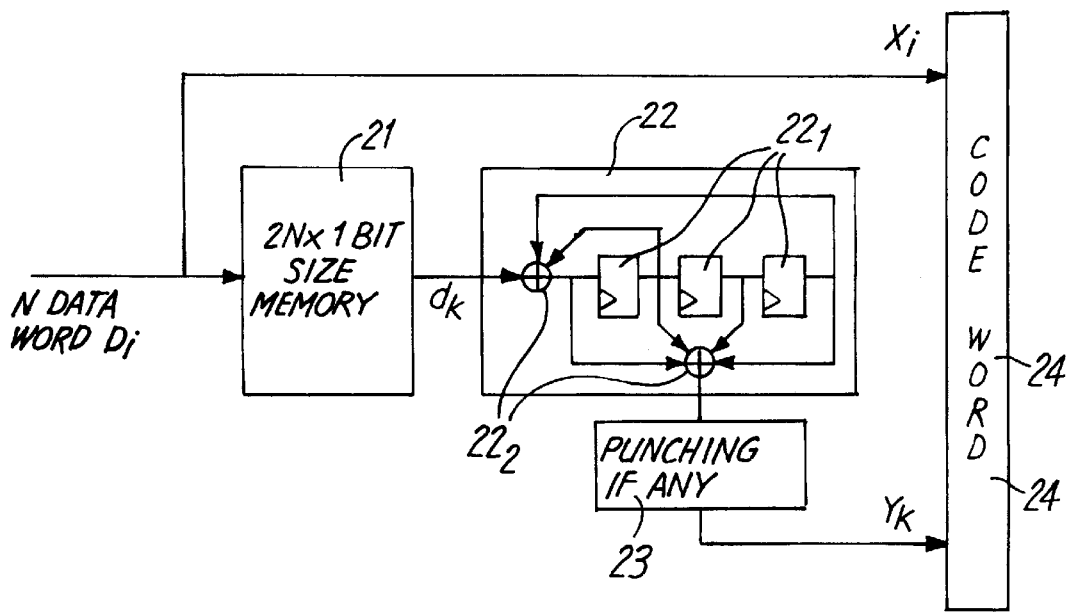
FIG. 2 shows a mode of implementation of the encoding method of the invention, that uses a memory with a size of 2N bits.

The encoding 14 may be implemented for example according to the structure shown in FIG. 2.

Figure 5:
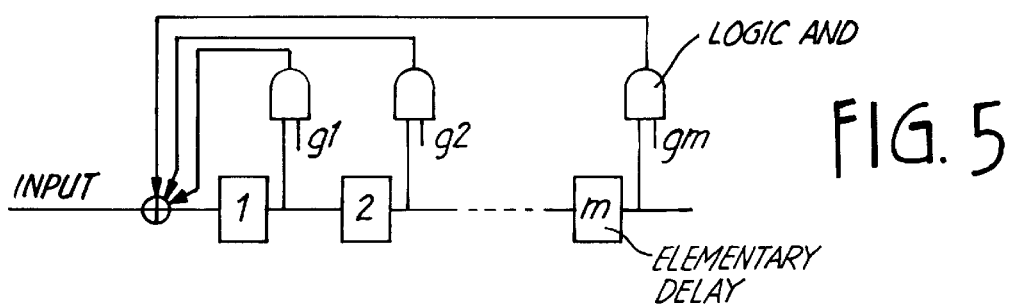
FIG. 5 provides a generic illustration of a polynomial scrambler G(D) discussed in the following formula.

It is assumed that it is desired to encode N bit messages by means of a recursive systematic encoder (CSR) using a generating polynomial G(D) with a length m and a period L. A polynomial of this kind is shown in FIG. 5 and commented on the following formula.

According to the invention, N (or L) is chosen so that it is a multiple of L (an explanation is given further below of a particular method when this is not the case) and each of the N source data elements (bits) is encoded twice.

For this purpose, the N data elements $d_i$ are copied twice into a memory 21 with a size of 2N×1 bit at addresses such that their subsequent read operations for introduction into the encoder 22 are separated by a number of periods that is a multiple of L.

Thus, if $k_1(i)$ is the instant of the first reading of a particular data element $d_i$ (called an original data element) then the instant $k_2(i)$ of the second reading (called a duplicated data element) verifies the following rule:

$$k_2(i)=k_1(i)+p_i.L \quad (1)$$

In other words, the second reading takes place $p_i.L-1$ instants after the first one.

The appended document which forms an integral part of the present description shows that this condition makes it possible to ascertain that the encoder will return systematically, at the end of a message, to the state in which it was at the beginning of the message.

Figure 4:
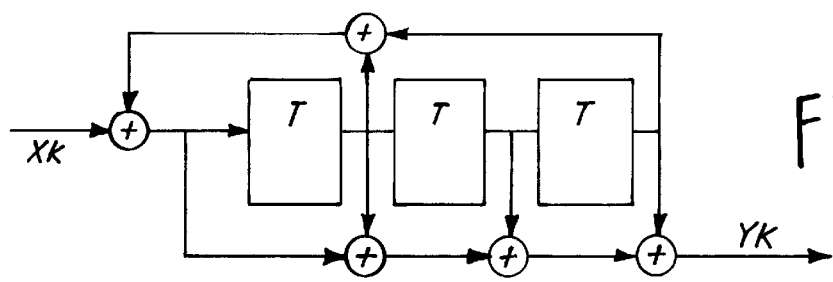
FIG. 4 is a simple example of a systematic recursive encoder that can be used according to the invention.

The encoder 22 is conventionally formed by a set of elementary delays 221 and adders 222. FIG. 4 illustrates another example of a systematic recursive convolutive encoder.

Figure 3:
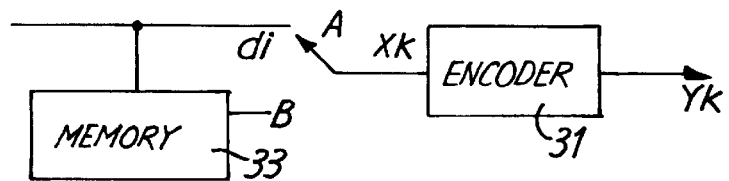
FIG. 3 is a simplified view of the implementation of the method of the invention, in the case where the first series of data elements is introduced in the natural order.

An encoder of this kind may be likened to a pseudo-random generator with a period L. For example, for the encoder of FIG. 3, the period L is 7. Thus, if we assume that the encoder of FIG. 3 is initialized in an "all 0" state (namely that all the outputs of the registers are at 0), if a non-zero data element is transmitted to it, the redundancy signal will be periodic (with a periodic pulse response of infinite length). By contrast, if this data element is transmitted once again to the encoder after a period of time that is a multiple of the period L, the encoder will resume its initial state. This property is used in the encoding method.

The data elements are therefore applied to the encoder CSR 22 initialized in the state 0. The encoder produces a redundancy $Y_k$. The output of the encoder is formed by the symbols $X_i$ representing N original data elements $d_i$ (this is a systematic code) and all or part of the redundancy $Y_k$. If the entire redundancy is used, the encoding efficiency is ⅓. To obtain higher efficiency levels, a punching 23 of the redundancy is necessary. For example, to obtain redundancy of ½, $Y_k$ is transmitted every other time.

The values of $X_i$ and $Y_k$ form the encoded message or code word, 24, to be transmitted.

The code thus defined is a block code, for the initial state and the final state of the encoding register are perfectly known (state 0). The final state of the encoder is indeed 0 for N pairs are applied to it (original data element and duplicated data element) under conditions such that the response (final state) of the encoder to a pair is always 0 (this is obvious if the original data element is a logic "0" and the relationship (1) ensures it if it is a "1").

Since the code is linear, the response of the encoder to the N pairs is the sum of the responses to each of the pairs and the final state is always 0, whatever may be the data elements forming the message. The symbols received may therefore be decoded independently of any other information, prior or subsequent, unlike in the case of the standard convolutive code. No termination bit is necessary to "close" the code.

It is possible to envisage many ways of applying the method twice to the encoder. A technique that gives efficient results is shown in its principle in FIG. 3.

The data elements to be transmitted $d_i$ are first of all given to the encoder 31 in the natural order (with the selector 32 in the position A). At the same time, these data elements are stored in the memory 33. The duplicated data elements are obtained with the selector 32 in the position B. The order of writing and reading in the memory 33 must of course comply with the rule defined here above.

Figure 6:
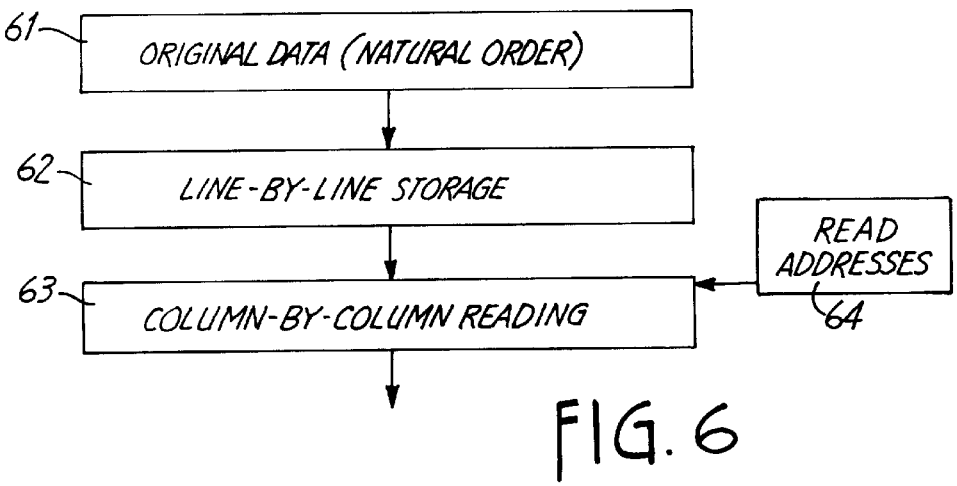
FIG. 6 presents the principle of the addressing of the memory of FIG. 3.

This may be done for example according to the method shown in FIG. 6 which comprises the following steps:
the original data elements are applied (61) in their natural order to the encoder ($k_f(i)=i$);
at the same time, these data elements are memorized (62), line after line in a memory with a size $n_1 \times n_c = N$, where $n_1$ is the number of rows, a multiple of L, and $n_c$ is the number of columns, a prime number with L;
the duplicated data elements are read (63) column by column and applied to the encoder in an order that meets the relationship (1). This means that at the instant $k_2$, the column being considered is travelled through along the successive rows until a data element is found that has been used in its original form at the instant $k_1$, such that $k_2-k_1$ is a multiple of L.

From a practical point of view, these read addresses can be memorized (ROM) 64 once and for all to be also used by the decoder.

The decoding is an iterative process that relies on the concept of extrinsic information introduced into the documents describing the "turbo-codes" already referred to in the introduction to the present application. The fundamental operator is a convolutive encode decoder with weighted inputs and outputs. This may be the optimal decoder (MAP) as described in the article by L. R. Bahl, J. Cocke, F. Jelinek and J. Raviv entitled "Optimal decoding of linear codes for minimizing symbol error rate" (IEEE Trans. Inform. Theory, Vol. IT-20, pp. 284–287, March 1974) or a Viterbi decoder with weighted outputs as presented in the patent application EP-92 460011.7 and in the article by C. Berrou, P. Addee, E. Angui and S. Faudeil "A low complexity soft-output Viterbi decoder architecture" (Proc. of IEEE ICC'93, Geneva, pp. 737–740, May 1993).

Figure 7:
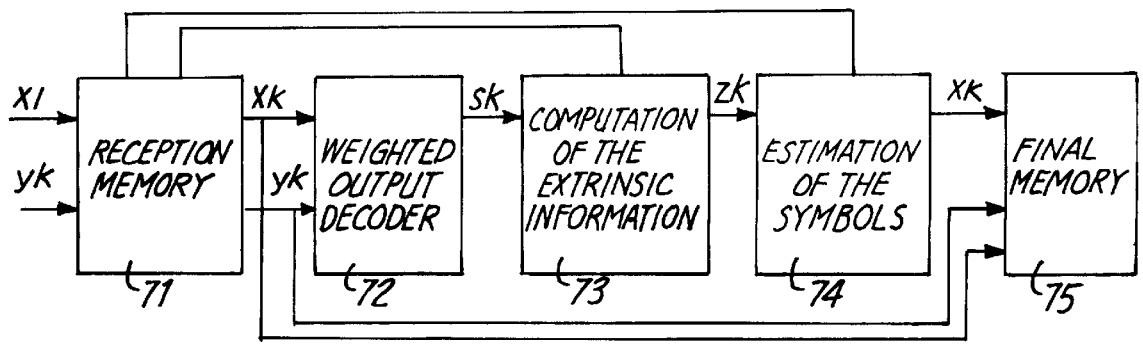
FIG. 7 illustrates the principle of an iteration of the decoding method of the invention.

The general structure of an iteration of the decoding method is shown in FIG. 7.

A reception memory 71 stores the data elements received ($x_i$ and $y_k$) When the data elements are not transmitted (because of punching), they are replaced by neutral values, namely analog zeros. A weighted output decoder 72 is initialized in such a way that the initial state of the encoder is taken into account.

The set of symbols $x_k$ and $y_k$ (these are the symbols $X_i$ and $Y_k$ transmitted by the encoder and damaged by noise), quantified on q bits, is then transmitted to the decoder 72 which provides estimated symbols of the data elements associated with confidence information elements. The estimation of these symbols and the computation of confidence are done by using the property wherein the state of the encoder is known at the end of the packet. The association of the estimated data elements and of the confidence enables the computation of an estimated symbol in a format equivalent to that of the received symbols. These symbols are referenced $s_k$. They are therefore 2N estimated symbols.

A computation 73 of the extrinsic information $z_k$ is then done. If the decoder 72 is a Viterbi decoder, the computation corresponds to the operations 83 and 87 of FIG. 8, which shall be referred to hereinafter.

Hence, a computation is made of $x'_k$ which is a weighted function of $x_k$ and the dual value $z_k$ (pertaining to the duplicated data element).

Each symbol $x'_k$ is then recorded in a memory called a final memory 75. The symbols $x_k$ and $y_k$ are transferred from the reception memory to the final memory without processing.

In FIG. 7, the reception memory 71 must give the $X_{ri}$ and $Y_{rk}$ values useful to the decoder 72 as well as the $X_{ri}$ values needed for the computation 73 of the extrinsic information and the estimation 74 of the symbols. It is understood that the system of memory management is integrated into the block known as the reception memory 71.

Two structures for the implementation of the decoding method may be considered. The first is the pipeline type structure. In this case, there are as many decoders as there are iterations. The reception memory is replaced by the final memory of the previous iteration. In this case, it is the $x'_k$ values that are transmitted to the decoder 72. The last iteration restores the estimated data elements to the addressee. These data elements are computed as being the sum of the output $s_k$ pertaining to the original data element and the dual extrinsic information $z_k$ (namely the data element corresponding to the duplicated data element).

The second structure is a sequential structure relying on the repeated use of a single decoder. In particular, it is well suited to communications at relatively low bit rates and enables the making of efficient low-cost decoders.

Figure 8:
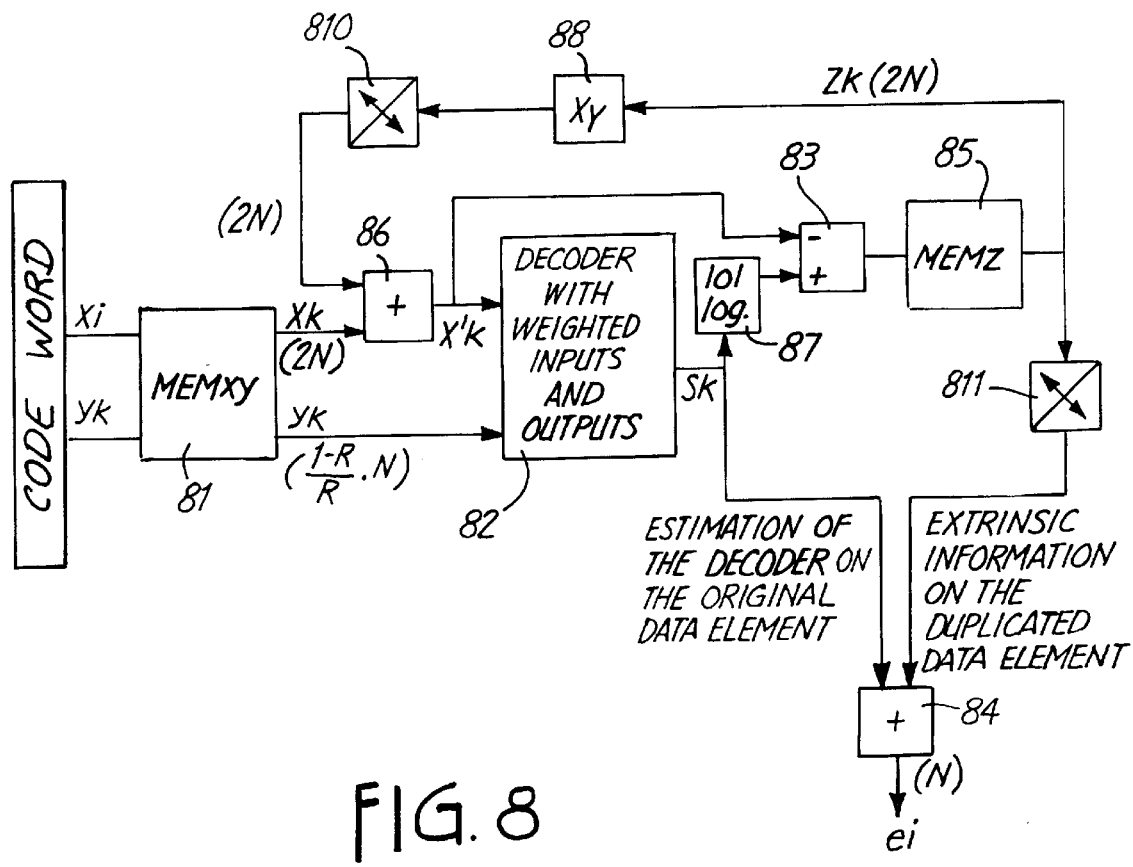
FIG. 8. shows an exemplary embodiment of the decoding method in the case of a sequential structure.

FIG. 8 illustrates a mode of implementation of this sequential structure.

The symbols $x_i$ and $y_k$ coming from the transmission channel are quantified on q bits and stored in a memory MEMxy 81. Each data element $x_i$ is memorized twice at places identical to those used for the encoding.

In one iteration, the decoder (MAP or Viterbi decoder) 82 processes the block in 2. N periods on the basis of the information elements $x'_k$ and $y_k$. When a redundancy data element $y_k$ is not available, if there has been punching at transmission, the decoder is supplied by a neutral value or an 'analog zero' value.

The iterations succeed one another instantly, i.e. the decoder is supplied without interruption, the data elements pertaining to the iteration p being contiguous to those pertaining to the iteration p-1. At the beginning of the processing, and then every 2. N periods, the decoder is set in the state 0 (the totalized metric of the state 0 is cancelled and the other totalized metrics are fixed at a high value). The processing stops at the pre-programmed iteration.

At the output of the decoder 82, two types of information are prepared at each iteration: the extrinsic information $z_k$ and the estimation $e_i$ pertaining to the encoded data element $d_i$.

Each step of the iterative process produces 2.N extrinsic information elements and N estimations.

Should the decoder 82 be a Viterbi decoder, the extrinsic information is simply computed as the difference 83 between the weighted output $s_k$, compressed by a logarithmic law 87, and the input $x'_k$ (it being assumed, in order to simplify the description, that the decoder has no latency). The estimation $e_i$ is for its part computed as the sum 84 of the output $s_k$ pertaining to the original data element and of the dual extrinsic information $z_k$ (pertaining to the duplicated data element). The extrinsic information elements are stored in a memory MEMz 85.

The input $x'_k$ of the decoder pertaining to the data element d is formed by the sum 86 of the symbol $x_k$ and of the dual extrinsic information $z_k$ prepared at the previous iteration, weighted at 88 by the coefficient $\gamma$ (at the first iteration, the memory MEMz 85 is filled with neutral values).

This means that if $x_k$ is the symbol whose place in the encoding corresponds to the original data element, the extrinsic information pertaining to the duplicated data is added to it and vice versa. It is this crossed exchange of information that, as the iterations continue, provides for the decreasing of the error rate at the estimated output of the decoder.

The elements 810 and 811 provide for the transposition between the original data element and the duplicated data element at the desired points in time.

The performance of the convolutive block turbo-code is all the better as N is high. For the low values of N, it is the correlation of the noises affecting the information elements $x_k$ and $z_k$ that are added to the input of the decoder. This limits the correction capacity of the code. It can easily be seen indeed that if these two estimations of one and the same data element are erroneous, the diversity inherent in the turbo-decoding is thereby necessarily reduced. One response to this problem is given by the logarithmic law 87 whose effects are to prevent heavyweight errors from amplifying during the iterative process. The logarithmic law relates to the absolute value and has the following form:

$$Y = \log(1 + x/\theta)$$

where $\theta$ is a constant chosen empirically. Double the absolute value of the symbols $x_k$ not affected by noise seems to be a good value for $\theta$.

The weighting coefficient $\gamma$ is set at a value below 1 and is adjusted according to the encoding efficiency ($\gamma$ is all the smaller as the efficiency is low).

The convolutive block turbo-code as described here above is built around information blocks whose length L is a multiple of the period L of the pseudo-random generator.

A simple way of processing blocks of an unspecified length N' is to choose a value of N that is a multiple of L immediately greater than N' and to supplement the N' codes to be encoded with N–N' known binary values, for example N–N' '0's. Obviously, these "0" values are not transmitted for the receiver part knows the number and the position of these filler "0"s.

Another procedure for obtaining these blocks whose length is a multiple of 4 (the usual practical example) when the period of the generator is 5 (the case of the polynomial 37) is the following: the encoder, every 5 periods, is supplied by a "0" and, correlatively, the decoder is set every 5 periods at a transition corresponding to a data element "0". We then have N'=(4. N)/5. The insertion of the filler "0"s does not necessarily require additional processing periods because, for the encoder as well as for the decoder, the insertion of a "0" may be combined (anticipated) with the insertion of the data elements that precede it.

Figure 9A:
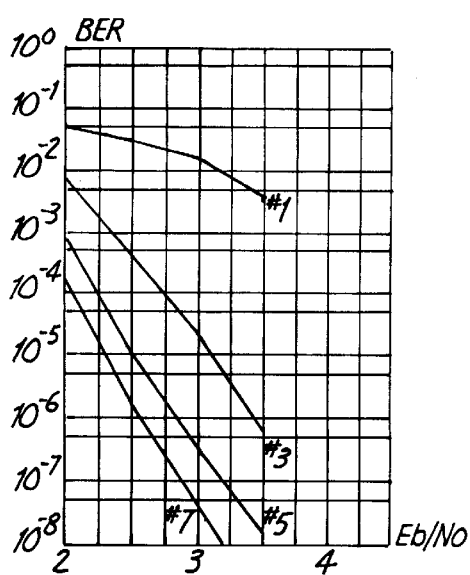
FIGS. 9A to 9E illustrate the results of decoding obtained according to the invention in various possible cases, and in comparison with other encoding techniques.
Figure 9B:
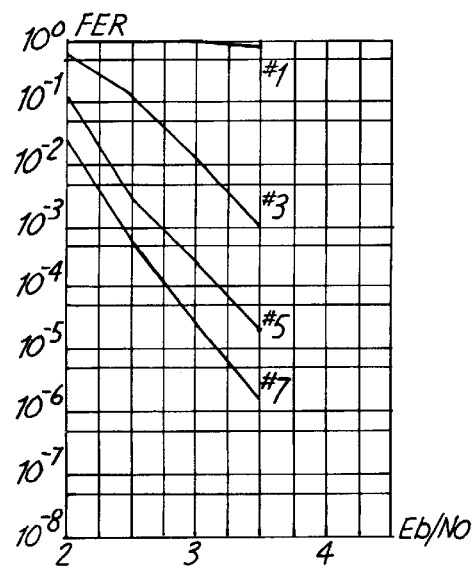
Figure 9C:
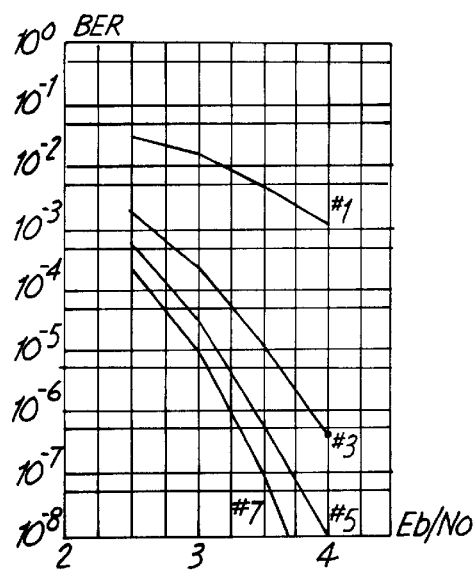
Figure 9D:
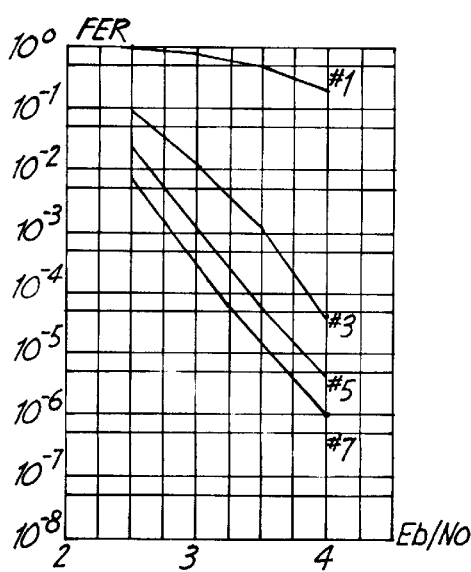
Figure 9E:
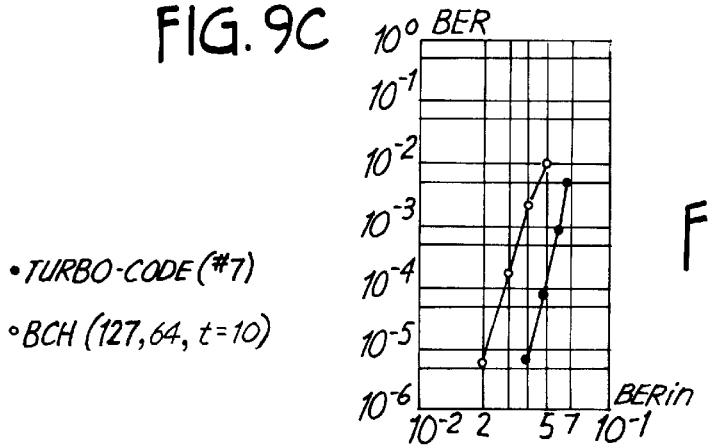

FIGS. 9A to 9E present some results of simulation obtained at the end of the iterations 1,3,5 and 7 in the following three cases:

FIGS. 9A and 9B: binary error rate (BER) and frame error rate (FER) with N=880 bits, R=½, inputs x and y quantified on 4 bits;

FIGS. 9C and 9D: binary error rate and frame error rate with N=220 bits, R=½, inputs x and y quantified on 4 bits;

FIG. 9E: comparison with the code BCH (127.64) when N=220 bits, R=½, inputs x and y quantified on 1 bit (firm decision decoding).

The X-axis represents either the signal-to-noise ratio $Eb/N_0$ or the binary error rate at input of the decoder $BER_{in}$. The Y-axis shows either the binary error rate BER at the output of the decoder or the frame error rate FER at the output of the decoder.

In these three simulations, the polynomial of the pseudo-random generator is 37 (period L=5), the redundancy generating polynomial is 25. The elementary decoder uses the modified Viterbi algorithm already mentioned. The case of FIG. 9E is compared with the code BCH (127.64) with an efficiency very close to ½ and with a corrective capacity t=10 (see the article referred to here above on a method for the decoding of a maximum likelihood convolutive encode and weighting of decisions, and corresponding decoder.

This comparison, although it relates to information blocks of different lengths, clearly shows that the proposed code, subjected to firm decision decoding, is more efficient than the BCH code with a decoding complexity that is far smaller (in its sequential version). The difference is even more marked of course if the turbo-decoder works in fine decision mode.

FORMULA

A CSR encodoer is built around a scrambler that is itself deduced from a pseudo-random generator with a memory length m. The polynomial of the generator is written as G(D)=1+

$$G(D) = 1 + \sum_{j=1}^{m} g_j \cdot D^j$$

(FIG. 5), D being the symbolic delay variable. The length L of the pseudo-random sequence of the generator is given by the smallest possible value of the degree r of the particular polynomial $P(D)=1+D^r$ as a multiple of $G(D)$. For example, if $G(D)=1+D^2+D^2+D^{3+D4}$, the first polynomial $P(D)$ a multiple of $G(D)$, is $1+D^5$. The length of the sequence is therefore 5. It can be shown, that L is in all cases smaller than or equal to $2^m-1$.

Theorem 1:

If $G(D)$ divides $1+D^L$, then GD) divides 1D', $\forall p$ integer$\geq 1$.

proof: the arithmetic series $$\sum_{k=0}^{p-1} A^k$$

verifies in standard algebra:

$$\sum_{k=0}^{p-1} A^k = \frac{1-A^p}{1-A}$$

and in the binary algebra:

$$\sum_{k=0}^{p-1} A^k = \frac{1+A^p}{1+A}$$

$1+A^P$ is therefore a multiple of $1+A$, and for $A=D^L$, $1+D'$ is a multiple of $1D^L$. Therefore, if $G(D)$ divides $1+D^L$, $G(D)$ divides also $1+D'$.

To say that a polynomial $P(D)$ is a multiple of $G(D)$ means in practice that if the binary sequence associated with $P(D)$ is applied to the encoder, starting from the state 0, this encoder will return to the state 0 at the end of the sequence.

EXAMPLE

Let $G(D)=D+D^2+D^3+D^4$. $G(D)$ divides $1+D^5$. The sequence 100001 makes the encoder leave the state 0 on the arrival oi the first '1' and makes it return to this state upon the arrival of the second '1'. According to the theorem 1, this is also the case for any sequence 100 . . . 001 where the two '1' are separated by 5.p-1'0', $\forall p$ integer$\geq 1$.

What is claimed is:

1. A method for the convolutive encoding of blocks each formed by a predetermined number N of source data elements,
wherein each of said source data elements is introduced twice into one and the same convolutive encoder implementing a generating polynomial with a period L in an order such that the two instances of introduction of one and same source data element $d_i$ are separated by the introduction of $(p_i.L)-1$ other source data elements, $p_i$ being a non-zero integer.

2. A method according to claim 1, wherein said source data elements are introduced into said decoder for a first time (these are called original data elements) in their natural order and then a second time (they are then called duplicated data elements) in an order such that the two instances of introduction of one and the same source data element $d_i$ are separated by the introduction of $(p_i.L)-1$ other source data elements, $p_i$ being a non-zero integer.

3. A method of encoding according to claim 2, wherein the order of introduction of said duplicated data elements is obtained by:

recording the source data elements row by row in a memory with a size $N=n_1*n_c$, $n_1$ being the number of rows which is a multiple of L and $n_c$ being the number of columns which is a prime number with L; and reading said duplicated data elements column by column in travelling, on a given column at the instant $k_2$, through the successive rows until there is found a data element that has been used for a first time (original data element) at the instant $k_1$ such that $k_1-k_2$ is a multiple of L.

4. A method of encoding according to claim 1, wherein this encoding is a systematic encoding, said source data elements being systematically transmitted in conjunction with the data elements delivered by said encoder.

5. A method according to claim 1, implementing a punching of the data delivered by said encoder.

6. A method according to claim 1, wherein the number N of source data elements forming a block is a multiple of the period L of the generating polynomial of said encoder.

7. A method according to claim 1 wherein, since the number N of source data elements forming a block is not a multiple of the period L of the generating polynomial of said encoder, each of said blocks is supplemented by a number N'-N of fixed values, N' being the multiple of L that is immediately greater than N.

8. A device for the convolutive encoding of blocks each formed by a predetermined number N of source data elements, comprising means for the introducing of each of said source data elements twice into one and the same convolutive encoder implementing a generating polynomial with a period L in an order such that the two instances of introduction of one and same source data element $d_i$ are separated by the introduction of $(p_i.L)-1$ other source data elements, $p_i$ being a non-zero integer.

9. A method for the decoding of an encoded block formed by encoded data, corresponding to a source block formed by a predetermined number N of source data elements,
wherein said block has undergone an encoding such that each of said source data elements is introduced twice into one and the same convolutive encoder implementing a generating polynomial with a period L in an order such that the two instances of introduction of one and same source data element $d_i$ are separated by the introduction of $(p_i.L)-1$ other source data elements, $p_i$ being a non-zero integer,
and wherein the method comprises a maximum likelihood decoding step taking account, firstly, of the received encoded data elements and, secondly, of the fact that the initial state and the final state of the encoder are known.

10. A decoding method according to claim 9 wherein, said encoding being a systematic encoding, the decoding method implements an iterative procedure comprising:

the duplication of the original symbols received and the association, with each of them, of one or other of the redundant data elements received so as to form 2.N pairs of information elements to be decoded;

a first iteration comprising the following steps:
the initialization of the decoding so as to take account of the initial state of the encoder;
the determining, for each pair of information elements, of an estimation $s_k$ of this pair and of an extrinsic information element $z_k$ representing the confidence associated with said estimation, as a function of the encoded data elements and the redundancy data elements received, and in taking account of the fact that the initial state and the final state of the encoder are known;

at least one intermediate iteration, repeating the determination step, in replacing the source data elements received by a weighted combination of the source data elements received and of the dual extrinsic information;

a last iteration delivering a definitive estimation of the data elements received corresponding to the summing of the estimation obtained from one of the redundancy symbols with the extrinsic information obtained from the other redundancy symbol, for each source symbol.

11. A method according to claim 10, wherein a logarithmic law is applied to the absolute value on the estimations produced during said steps of determination.

12. A method according to claim 10, wherein said iterations are implemented by:

reusing a single decoder several times, at a rate greater than that of the transmitted data element;

cascading several decoding modules, each corresponding to an iteration.

13. A decoder of an encoded block formed by encoded data elements corresponding to a source block formed by a predetermined number N of source data elements, wherein said source block has undergone an encoding such that each of said source data elements is introduced twice into one and the same convolutive encoder implementing a generating polynomial with a period L in an order such that the two instances of introduction of one and same source data element $d_i$ are separated by the introduction of $(p_i.L)-1$ other source data elements, $p_i$ being a non-zero integer, and wherein said decoder comprises maximum likelihood decoding means taking account, firstly, of the encoded data elements received and, secondly, of the fact that the initial state and the final state of the encoder are known.

* * * * *

UNITED STATES PATENT AND TRADEMARK OFFICE
CERTIFICATE OF CORRECTION

PATENT NO. : 6,119,264
DATED : September 12, 2000
INVENTOR(S) : Claude Berrou et al.

Page 1 of 1

It is certified that error appears in the above-identified patent and that said Letters Patent is hereby corrected as shown below:

Title page,
Item [30], Foreign Application Priority Data, delete "[FR] France......96 04455", insert -- [FR] France.......96 04485 --

Column 2,
Line 3, delete "correspondents", insert -- correspondants --

Column 4,
Line 18, delete "N'N", insert -- N'-N --

Column 9,
Line 69, delete "γis", insert -- γ is --

Column 10,
Line 60, delete "G(D)=1+"

Column 11,
Line 3, delete "$1+D^2+D^2+D^{3+D4}$", insert -- $1+D+D^2+D^3+D^4$ --
Line 8, delete "GD)", insert -- G(D) --
Line 8, delete "1D'", insert -- 1+D' --
Line 30, delete "$1D^{L-}$", insert -- $1+D^L$ --
Line 43, delete "'1'", insert -- '1's --
Line 56, delete "decoder", insert -- encoder --

Signed and Sealed this

Seventh Day of May, 2002

Attest:

Attesting Officer

JAMES E. ROGAN
*Director of the United States Patent and Trademark Office*